(12) United States Patent
Zhang et al.

(10) Patent No.: US 9,966,338 B1
(45) Date of Patent: May 8, 2018

(54) PRE-SPACER SELF-ALIGNED CUT FORMATION

(71) Applicant: GLOBALFOUNDRIES Inc., Grand Cayman (KY)

(72) Inventors: Xunyuan Zhang, Troy, NY (US); Shao Beng Law, Watervliet, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days. days.

(21) Appl. No.: 15/490,181

(22) Filed: Apr. 18, 2017

(51) Int. Cl.
*H01L 23/48* (2006.01)
*H01L 23/528* (2006.01)
*H01L 21/768* (2006.01)

(52) U.S. Cl.
CPC ...... *H01L 23/5283* (2013.01); *H01L 21/7685* (2013.01); *H01L 21/76804* (2013.01); *H01L 21/76883* (2013.01)

(58) Field of Classification Search
CPC .............. H01L 23/528; H01L 23/5286; H01L 23/5283; H01L 23/525; H01L 21/76804; H01L 21/7685; H01L 21/76852; H01L 21/76883
See application file for complete search history.

(56) References Cited

U.S. PATENT DOCUMENTS

| 6,030,896 A * | 2/2000 | Brown ............... H01L 21/7685 257/762 |
| 2003/0116852 A1* | 6/2003 | Watanabe ......... H01L 21/76801 257/758 |
| 2006/0154463 A1* | 7/2006 | Furukawa ........... H01L 21/7682 438/596 |

* cited by examiner

*Primary Examiner* — Yosef Gebreyesus
(74) *Attorney, Agent, or Firm* — Thompson Hine LLP; Anthony Canale

(57) ABSTRACT

Methods of forming self-aligned cuts and structures formed with self-aligned cuts. A dielectric layer is formed on a metal hardmask layer, and a mandrel is formed on the dielectric layer. A cut is formed that extends through the dielectric layer to the metal hardmask layer. A section of a metal layer is formed on an area of the metal hardmask layer exposed by the cut in the dielectric layer. After the metal layer is formed, a spacer is formed on a vertical sidewall of the mandrel.

18 Claims, 14 Drawing Sheets

PRE-SPACER SELF-ALIGNED CUT FORMATION

BACKGROUND

The present invention relates to integrated circuits and semiconductor device fabrication and, more specifically, to methods for forming self-aligned cuts and structures formed with self-aligned cuts.

A back-end-of-line (BEOL) interconnect structure may be used to connect device structures fabricated on a substrate during front-end-of-line (FEOL) processing with each other and with the environment external to the chip. Self-aligned patterning processes used to form a BEOL interconnect structure involve mandrels as sacrificial features that establish a feature pitch. Sidewall spacers, which have a smaller thickness than permitted by the current ground rules for optical lithography, are formed adjacent to the vertical sidewalls of the mandrels. After selective removal of the mandrels, the sidewall spacers are used as an etch mask to etch an underlying hardmask, for example, with a directional reactive ion etch (RIE) process. Unmasked features in the pattern are transferred from the hardmask to a dielectric layer to define trenches in which the wires of the BEOL interconnect are formed.

Cuts may be formed in mandrels with a cut mask and etching in order to section the mandrels and define gaps that subsequently are used to form adjacent wires that are spaced apart at their tips with a tip-to-tip spacing. A pattern reflecting the cut mandrels may be transferred to the hardmask and subsequently from the hardmask to the patterned dielectric layer. Non-mandrel cuts may also be formed in the hardmask itself and filled by dielectric material when the sidewall spacers are formed. These non-mandrel cuts are also transferred to the hardmask and subsequently from the hardmask to the patterned dielectric layer. The mandrel and non-mandrel cuts are filled by dielectric material of the patterned dielectric layer to fill the gaps and provide electrical isolation between the tips of the wires facing each other across the gaps.

Improved methods of forming self-aligned cuts and structures formed with self-aligned cuts are needed.

SUMMARY

In an embodiment of the invention, a method includes forming a dielectric layer on a metal hardmask layer, forming a mandrel on the dielectric layer, and forming a cut that extends through the dielectric layer to the metal hardmask layer. A section of a metal layer is formed on an area of the metal hardmask layer exposed by the cut in the dielectric layer. After the metal layer is formed, a spacer is formed on a vertical sidewall of the mandrel.

In an embodiment of the invention, a structure includes a metallization level with a trench and a wire in the trench. The wire includes a sidewall that is planar and a tab that projects outwardly from the sidewall.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
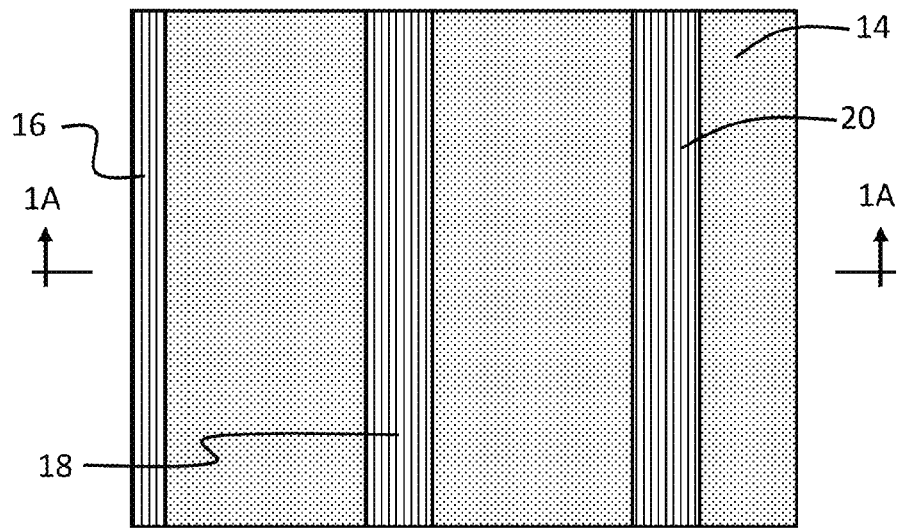
FIG. 1 is a top view of a structure at an initial fabrication stage of a processing method in accordance with embodiments of the invention.
Figure 1A:
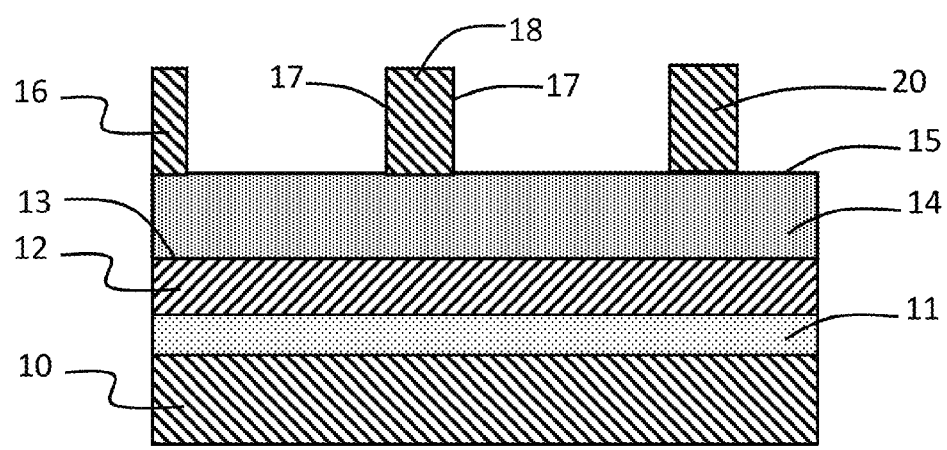
FIG. 1A is a cross-sectional view of the structure of FIG. 1 taken generally along line 1A-1A in FIG. 1.

With reference to FIGS. 1, 1A and in accordance with embodiments of the invention, a dielectric layer 10 is processed according to the processing method to form an interconnect structure of a metallization level. The dielectric layer 10 may be composed of an electrically-insulating dielectric material, such as hydrogen-enriched silicon oxycarbide (SiCOH) produced from an octamethylcyclotetrasiloxane (OMCTS) precursor or another type of low-k dielectric material. The dielectric layer 10 may be located on a substrate that includes device structures fabricated by front-end-of-line (FEOL) processing to form an integrated circuit. A dielectric hardmask 11 is located on a top surface of the dielectric layer 10. The dielectric hardmask 11 may be composed of a dielectric material, such as silicon dioxide ($SiO_2$), deposited by chemical vapor deposition (CVD).

A hardmask layer 12 is located on the top surface of the dielectric hardmask 11. The hardmask layer 12 may be comprised of a metal, such as titanium nitride (TiN), deposited by physical vapor deposition (PVD). The hardmask layer 12 is removable from the dielectric hardmask 11 selective to the material of the dielectric hardmask 11. A dielectric layer 14 is formed on the hardmask layer 12. The dielectric layer 14 may be composed of a dielectric material, such as silicon nitride ($Si_3N_4$), deposited by CVD. The dielectric layer 14 is removable from the hardmask layer 12 selective to the material of the hardmask layer 12. As used herein, the term "selective" in reference to a material removal process (e.g., etching) denotes that the material removal rate (i.e., etch rate) for the targeted material is higher than the material removal rate (i.e., etch rate) for at least another material exposed to the material removal process.

Mandrels 16, 18, 20 are formed on a top surface 15 of the dielectric layer 14. The mandrels 16, 18, 20 may be concurrently formed by depositing a blanket layer of a material on the entire top surface 15 of the dielectric layer 14 and patterning the blanket layer by lithography and etching using a lithography stack. For example, a sidewall image transfer (SIT) process or a self-aligned double patterning (SADP) process may be used to pattern the mandrels 16, 18, 20. The mandrels 16, 18, 20 may be composed of silicon, such as amorphous silicon, that is deposited at a low temperature by CVD. The mandrels 16, 18, 20 have vertical sidewalls 17 that project vertically relative to the top surface 15 of the dielectric layer 14.

Figure 2:
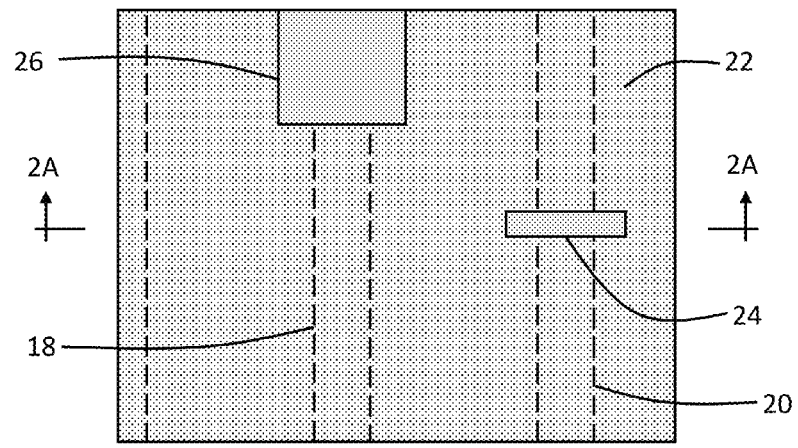
FIGS. 2-8 and FIGS. 2A-8A are top and cross-sectional views, respectively, of the structure at successive fabrication stages of the processing method subsequent to FIG. 1 and FIG. 1A.
Figure 2A:
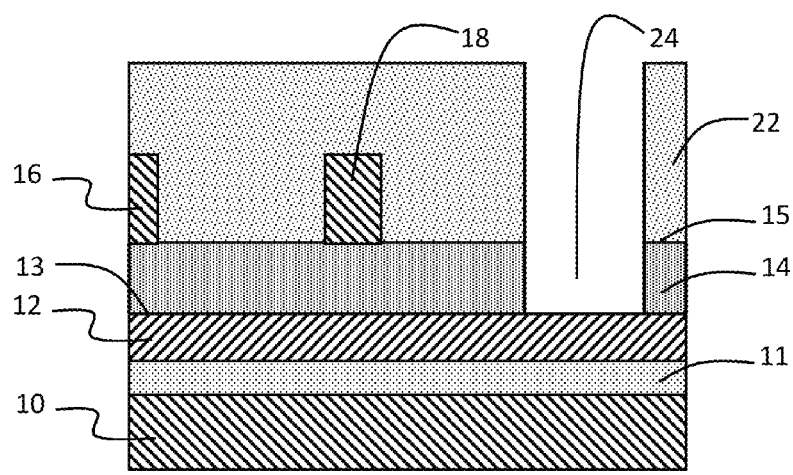

With reference to FIGS. 2, 2A in which like reference numerals refer to like features in FIGS. 1, 1A and at a subsequent fabrication stage, a mandrel cut mask 22 is formed on a top surface 15 of the dielectric layer 14 and patterned. The mandrel cut mask 22 may include an organic planarization layer (OPL) material applied by spin-coating on the top surface 15 of the dielectric layer 14. The mandrel cut mask 22 may be lithographically patterned to define openings at the intended locations for a narrow mandrel cut 24 that penetrates through the mandrel 20 and a larger mandrel cut 26 that penetrates through the mandrel 18. The shape of the mandrel cut 26 may be optimized using optical proximity correction (OPC) as a photolithography enhancement technique when the mandrel cut mask 22 is formed.

The mandrel cuts 24, 26 are formed in the mandrels 18, 20 using an etching process, such as reactive ion etching (RIE), that removes the material of mandrels 18, 20 from areas not masked by the mandrel cut mask 22. The etching process may also remove the dielectric material of the dielectric layer 14 over the areas of the openings in the mandrel cut mask 22 and stop on the material of the hardmask layer 12. The mandrel cuts 24, 26 remove respective sections of the mandrels 18, 20, and exposed areas of the hardmask layer 12 over the openings in the mandrel cut mask 22 used to form the mandrel cuts 24, 26. The mandrel cut 24 is subsequently used to make a narrow tip-to-tip cut in subsequently-formed wires, and the mandrel cut 26 is used to make a larger area cut feature. The width of the mandrel cut 26 may be less than or equal to a sum of the width of the mandrel 18 and twice the width of subsequently-formed spacers.

Figure 3:
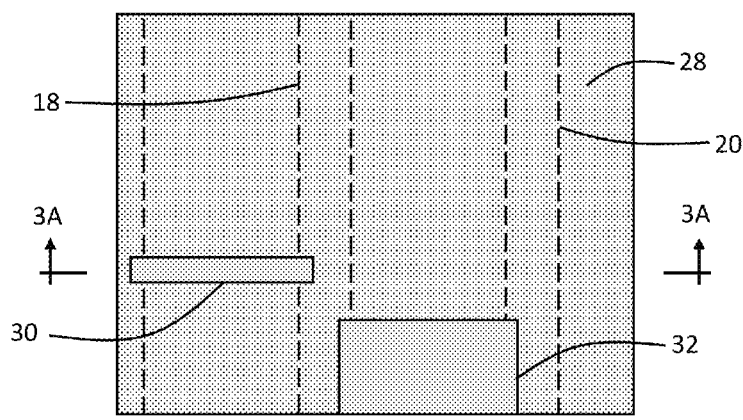
Figure 3A:
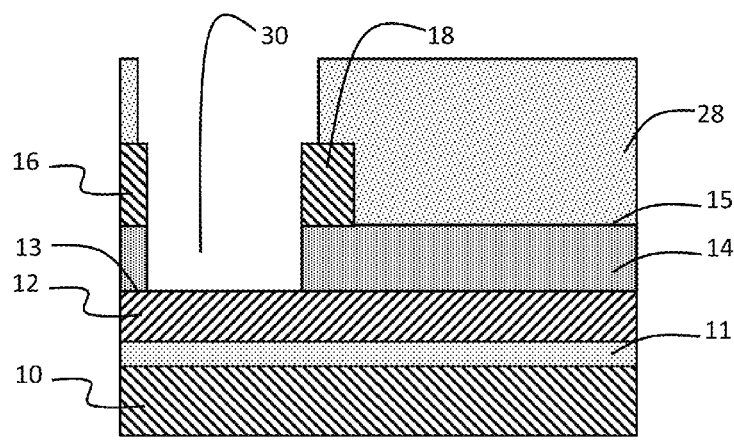

With reference to FIGS. 3, 3A in which like reference numerals refer to like features in FIGS. 2, 2A and at a subsequent fabrication stage, the mandrel cut mask 22 is removed by a cleaning process, and a non-mandrel cut mask 28 is formed on the top surface 15 of the dielectric layer 14. The non-mandrel cut mask 28 may include an organic planarization layer (OPL) material applied by spin-coating on the top surface 15 of the dielectric layer 14. The non-mandrel cut mask 28 may be lithographically patterned to define openings at the intended locations for a narrow non-mandrel cut 30 in the dielectric layer 14 between mandrel 16 and mandrel 18, and a wider non-mandrel cut 32 in the dielectric layer 14 between mandrel 18 and mandrel 20. The non-mandrel cuts 30, 32 are formed in the dielectric layer 14 using an etching process, such as reactive ion etching (RIE), that removes the material of the dielectric layer 14 from areas not masked by the non-mandrel cut mask 28. The non-mandrel cuts 30, 32 remove respective sections of the dielectric layer 14. The non-mandrel cut 30 is later used to make a cut with a narrow tip-to-tip spacing between wires formed in connection with the cut mandrel 20, and the mandrel cut 26 is used to make a cut of larger area in mandrel 18. Areas of the hardmask layer 12 are exposed through the non-mandrel cuts 30, 32.

Figure 4:
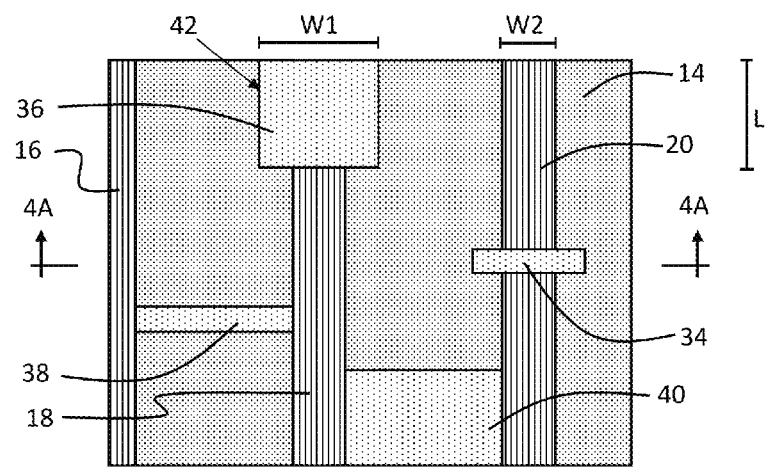
Figure 4A:
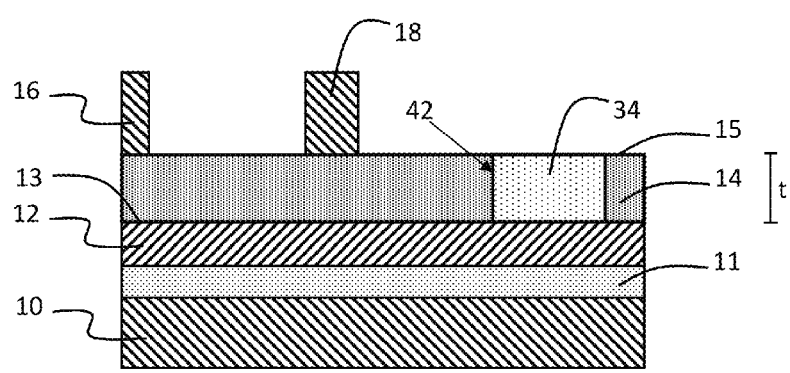

With reference to FIGS. 4, 4A in which like reference numerals refer to like features in FIGS. 3, 3A and at a subsequent fabrication stage, the non-mandrel cut mask 28 is removed by a cleaning process. Sections 34, 36, 38, 40 of a mask layer 42 are formed on respective areas on the top surface 13 of the hardmask layer 12 that are revealed by the removal of the dielectric layer 14 when the mandrel cuts 24, 26 and non-mandrel cuts 30, 32 are formed. Sections 34, 36 of the mask layer 42 are respectively formed on the respective areas of the hardmask layer 12 exposed by the mandrel cuts 24, 26, and sections 38, 40 of the mask layer 42 are respectively formed on the respective areas of the hardmask layer 12 exposed by the non-mandrel cuts 30, 32. The mask layer 42 is formed before the mandrels 16, 18 are pulled.

The sections 34, 36, 38, 40 of a mask layer 42 have an outer perimeter that matches the boundary at the inner edges of the mandrel cuts 24, 26 and non-mandrel cuts 30, 32. The patterned dielectric layer 14 establishes a template for the formation of the sections 34, 36, 38, 40 of the mask layer 42. In an embodiment, the mask layer 42 may have a thickness that is less or equal to the thickness, t, of the dielectric layer 14.

The section 34 of the mask layer 42 has a width, W1, that is greater than the width, W2, of the mandrel 18. Similarly, the section 36 of the mask layer 42 has a width, W1, that is greater than the width, W2, of the mandrel 20. These width differences subsequently manifest themselves when the hardmask layer 12 is patterned by etching and then when the dielectric layer 10 is subsequently etched using the patterned hardmask layer 12.

The mask layer 42 may be selectively deposited such that its material nucleates and forms on the surface of the hardmask layer 12 to generate the sections 34, 36, 38, 40, but fails to nucleate and form on the top surfaces of non-metal objects, such as the mandrels 16 and dielectric layer 14. The selective deposition may be promoted by treating the surface areas of the hardmask layer 12 revealed by the patterning of the overlying dielectric layer 14. The mask layer 42 may be composed of a metal deposited by low-temperature CVD or by atomic layer deposition (ALD). In an embodiment, the mask layer 42 may be composed of ruthenium (Ru) formed by CVD or ALD using a volatile metal precursor of ruthenium. In an embodiment, the mask layer 42 may be composed of cobalt (Co) formed by CVD or ALD using a volatile metal precursor of cobalt. In an embodiment, the mask layer 42 may be composed of copper (Cu) formed by electroless plating.

Figure 5:
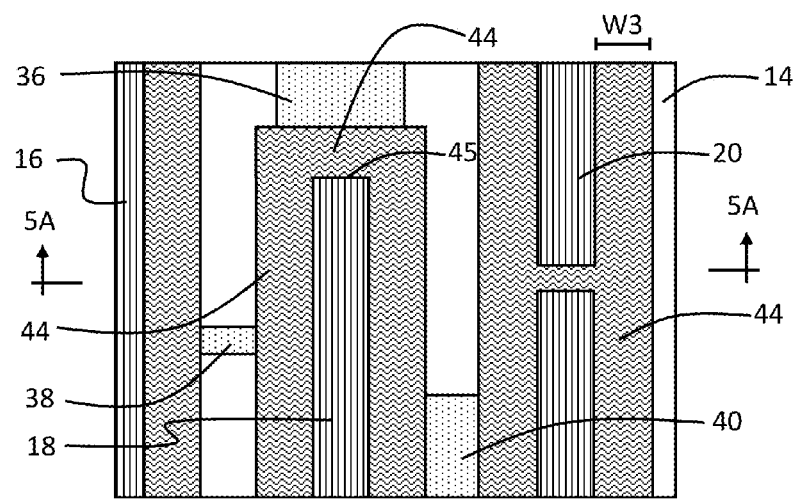
Figure 5A:
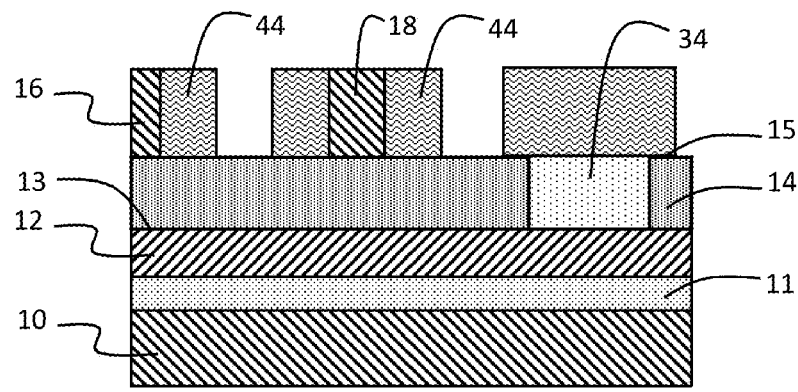

With reference to FIGS. 5, 5A in which like reference numerals refer to like features in FIGS. 4, 4A and at a subsequent fabrication stage, sidewall spacers 44 are formed at locations on the top surface 15 of the dielectric layer 14 adjacent to the vertical sidewalls of the mandrels 16, 18, 20 and at an end 45 of mandrel 18 at the location of the mandrel cut 24. The spacers 44 are formed after the mandrel cuts 24, 26 and non-mandrel cuts 30, 32 are performed. The sidewall spacers 44 may be formed by depositing a conformal layer comprised of a dielectric material, such as silicon dioxide (SiO$_2$), and shaping the conformal layer with an anisotropic etching process, such as reactive ion etching (RIE). The anisotropic etching process preferentially removes the dielectric material from horizontal surfaces, such as the top surfaces of the dielectric layer 14, the mandrels 16, 18, 20, and the sections 34, 36, 38, 40 of the mask layer 42 in deference to the dielectric material remaining as sidewall spacers 44. The material constituting the sidewall spacers 44 may be chosen to be removed by a given etch chemistry selective to the materials of the dielectric layer 14, the mandrels 16, 18, 20, and the sections 34, 36, 38, 40 of the mask layer 42. The sidewall spacers 44 may be comprised of a dielectric material, such as silicon dioxide (SiO$_2$) deposited by atomic layer deposition (ALD).

The sidewall spacers 44 have a width, W3, this is nominally equal to the thickness of the conformal layer that is etched. The sidewall spacers 44 completely or fully cover the section 34 of the mask layer 42 such that the section 34 is buried beneath the spacers 44 and vertically between the spacers 44 and the hardmask layer 12. The section 36 of the mask layer 42 is only partially covered by the sidewall spacer 44 on the cut end of the mandrel 18. The length of the section 36 of the mask layer 42 is established by the corresponding dimension of the mandrel cut 26 in the dielectric layer 14 minus the width of the spacer 44 on the end 45 of mandrel 18 and the width of the space on an end of a mandrel (not shown), if any, that has an end across the mandrel cut 26 from the end 45. Similarly, the sidewall spacers 44 partially cover the sections 38, 40 of the mask layer 42 in the non-mandrel cuts 30, 32 over their respective side edges.

Figure 6:
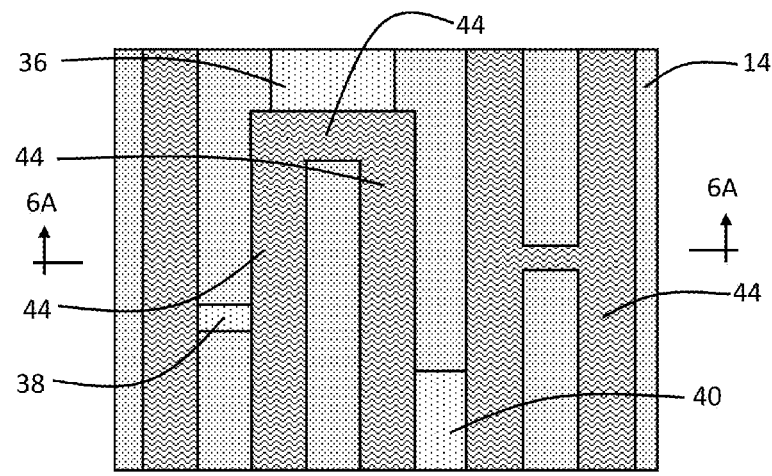
Figure 6A:
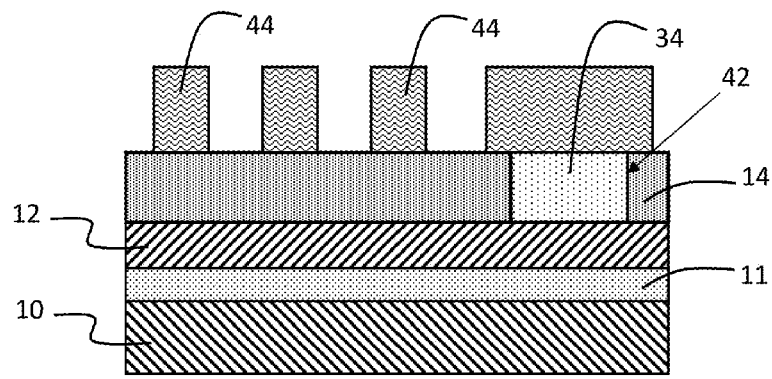

With reference to FIGS. 6, 6A in which like reference numerals refer to like features in FIGS. 5, 5A and at a subsequent fabrication stage, the mandrels 16, 18, 20 are removed selective to the materials of the dielectric layer 14, the sections 34, 36, 38, 40 of the mask layer 42, and the sidewall spacers 44 with an etching process having a suitable etch chemistry. The top surface 15 of the dielectric layer 14 is revealed over areas on the top surface 15 that are exposed when the mandrels 16, 18, 20 are pulled.

The sections 34, 36, 38, 40 of the mask layer 42 and the sidewall spacers 44 cover areas of the top surface 15 of the dielectric layer. Section 34 of the mask layer 42 is buried beneath the material of the sidewall spacer 44 that fully or completely fills the cut 24 between the respective ends or tips of the two mandrel segments resulting from the cut mandrel 18. The other sections 36, 38, 40 of the mask layer 42 are partially, but not completely, covered by the spacers 44.

Figure 7:
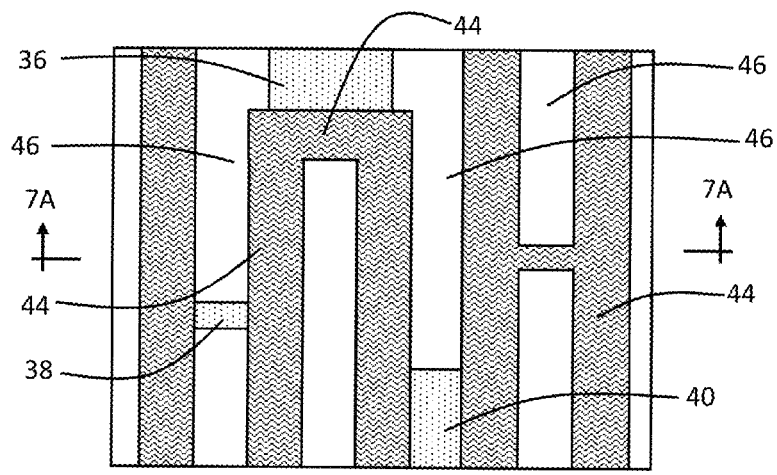
Figure 7A:
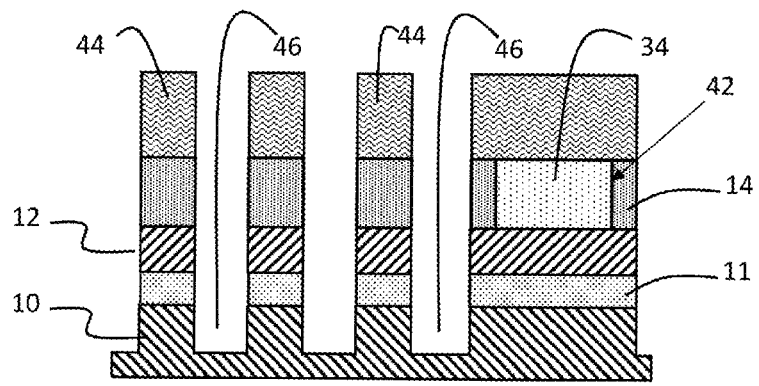

With reference to FIGS. 7, 7A in which like reference numerals refer to like features in FIGS. 6, 6A and at a subsequent fabrication stage, the dielectric layer 14 is patterned subsequent to the removal of the mandrels 16, 18, 20 by an etching process with the sidewall spacers 44 and the sections 34, 36, 38, 40 of the mask layer 42 operating as an etch mask. The etching process that opens the dielectric layer 14 may employ an etch chemistry that removes the material of the dielectric layer 14 that is not covered by sidewall spacers 44 and sections 34, 36, 38, 40 of the mask layer 42. At the conclusion of the etching process, sections of the dielectric layer 14 are located vertically between the sidewall spacers 44 and the hardmask layer 12. The sections 34, 36, 38, 40 of the mask layer 42 are in direct contact with the hardmask layer 12 because the dielectric layer 14 was patterned when forming the mask layer 42 in earlier fabrication stages of the processing method.

The hardmask layer 12 is then patterned by an etching process with the sidewall spacers 44 and the sections 34, 36, 38, 40 of the mask layer 42 operating as an etch mask. The etching process may employ an etch chemistry that removes the material of the hardmask layer 12 selective to the materials of the sidewall spacers 44 and the mask layer 42, as well as selective to the material of the dielectric hardmask 11 that operates as an etch stop when the hardmask layer 12 is patterned. Sections of the hardmask layer 12 are preserved and retained during its etching in elongated strips over the areas covered by the sidewall spacers 44. Sections of the hardmask layer 12 are likewise preserved and retained during its etching over the areas covered by the sections 34, 36, 38, 40 of the mask layer 42.

The dielectric hardmask 11 and the dielectric layer 10 are subsequently etched to form trenches 46 in the dielectric layer 10 except for those areas of the dielectric layer 10 masked by the hardmask layer 12 and protected against removal by etching. Those masked areas on the dielectric layer 10 are determined by the patterning of the hardmask layer 12 based on complementary areas covered by the sections 34, 36, 38, 40 of the mask layer 42 and the sidewall spacers 44. The trenches 46 are located in non-masked areas.

Figure 8:
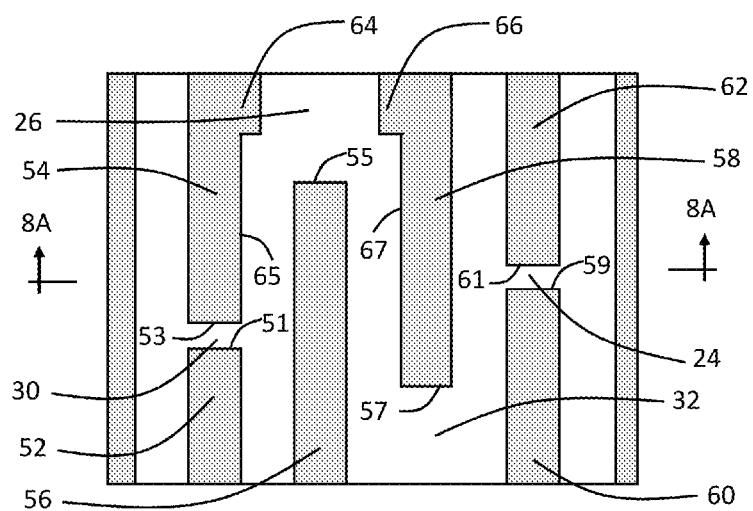
Figure 8A:
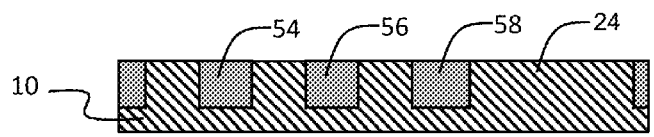

With reference to FIGS. 8, 8A in which like reference numerals refer to like features in FIGS. 7, 7A and at a subsequent fabrication stage, after the dielectric layer 10 is etched, the sections 34, 36, 38, 40 of the mask layer 42, the sidewall spacers 44, and the hardmask layer 12 may be removed by one or more etching or cleaning processes. The trenches 46 (FIGS. 7, 7A) in the dielectric layer 10 are filled with a conductor to form wires 52, 54, 56, 58, 60, 62. A liner (not shown) comprised of titanium (Ti), titanium nitride (TiN), tantalum (Ta), tantalum nitride (TaN), or a layered combination of these materials (e.g., a bilayer of Ti/TiN) may be applied to the trenches before filling with the metal. The wires 52, 54, 56, 58, 60, 62 may be comprised of a low-resistivity conductor formed using a deposition process, such as a metal like copper (Cu) formed by electroplating or electroless deposition.

The shapes and geometries of the wires 52, 54, 56, 58, 60, 62 reproduce the shapes and geometries of the patterned features in the hardmask layer 12, which are established by the shapes and geometries of the sections 34, 36, 38, 40 of the mask layer 42 and the shapes and geometries of the sidewall spacers 44. Adjacent pairs of the wires 52, 54, 56, 58, 60, 62 are separated from each other by sections of the electrical insulator of the dielectric layer 10. When the dielectric layer 10 is etched, these sections of the dielectric layer 10 are masked by strips of the hardmask layer 12 that are preserved over areas of the hardmask layer 12 masked during its patterning by the sections 34, 36, 38, 40 of the mask layer 42 and sidewall spacers 44.

The dielectric material of the dielectric layer 10 located in the non-mandrel cut 30 separates an end 51 of wire 52 from an end 53 of wire 54. Similarly, dielectric material of the dielectric layer 10 located in the mandrel cut 24 separates an end 59 of wire 60 from an end 61 of wire 62. In the representative embodiment, the spacers 44 formed on the ends 59, 61 fill the tip-to-tip gap between the ends 59, 61. The tip-to-tip distance between the end 59 of wire 58 and the end 61 of wire 60 is depicted in the representative embodiment as less than or equal to twice the width of the sidewall spacers 44 such that the cut 24 is completely filled by spacer material and the section 34 of the mask layer 42 is covered. However, the tip-to-tip distance between the end 59 and the end 61 can be greater than twice the width of the sidewall spacers 44 because the section 34 of the mask layer 42 would mask the dielectric layer 10 across any open gap between the sidewall spacer 44 on the end 59 and the spacer 44 on the end 61.

The non-mandrel cut 32, which has a larger area than mandrel cut 30, is filled by the dielectric material of the dielectric layer 10 adjacent to the end 57 of wire 58. Dielectric material of the dielectric layer 10 also fills the mandrel cut 26, which has a larger area than mandrel cut 24, adjacent to the end 55 of wire 56. The mandrel cut 26 can be larger than conventional mandrel cuts because the length of the section 36 of the mask layer 42 establishes the tip-to-tip distance between the end 55 of wire 56 and any adjacent wire (not shown) having an end in a tip-to-tip arrangement with the end 55 of wire 56. The size of the mandrel cut 26 is not limited by the width of the spacers 44.

In the representative embodiment, the width of the mandrel cut 26 is less than a sum of the width of the mandrel 18 and twice the width of subsequently-formed spacers 44. As a consequence, the wires 54 and 58, as well as the etched trenches in which these wires 54, 58 are formed, will have respective appendages or tabs 64, 66 that project inwardly toward each other. The wire 54 may have a vertical sidewall 65 that is planar, and the tab 64 projects outwardly from the sidewall 65 of the wire 54 to interrupt its planarity. The wire 58 may have a vertical sidewall 67 that is planar, and the tab 66 projects outwardly from the sidewall 67 of the wire 58 to interrupt its planarity. The tabs 64, 66 are located laterally between the sidewall 65 and the sidewall 67. The placement of the tabs 64, 66 narrows the dielectric-filled mandrel cut 26. The dimensions of the tabs 64, 66 may vary with the dimensions and location of the mandrel cut 26. In the latter regard, for example, one of the tabs 64, 66 may be absent if the location of the mandrel cut 26 is sufficiently off-center relative to the centerline of the mandrel 18.

The mandrel cuts 24, 26 may be self-aligned and their formation may involve only two masks without the need for an additional to perform dummy removal. In the latter regard, the mandrel cut 26 may be used for dummy removal and relies on the same mask used to provide the mandrel cut 24. The tabs 64, 66, if one or both are present, may provide a resistance benefit and a capacitance benefit to the completed interconnect structure.

Figure 9:
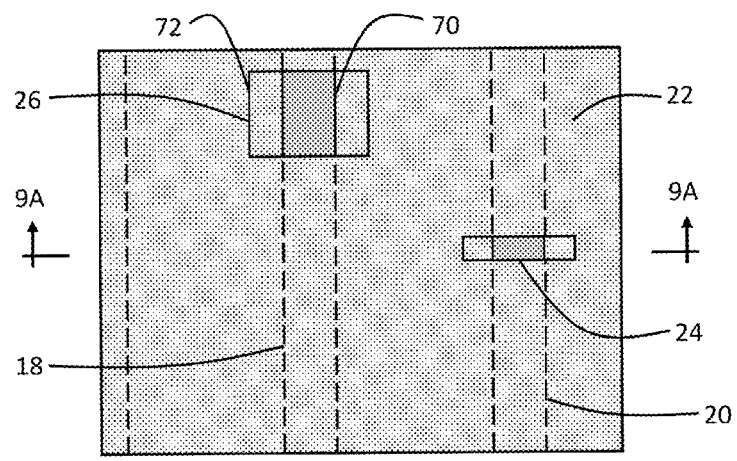
FIG. 9 is a top view of a structure at a fabrication stage subsequent to FIG. 1 of a processing method in accordance with embodiments of the invention.
Figure 9A:
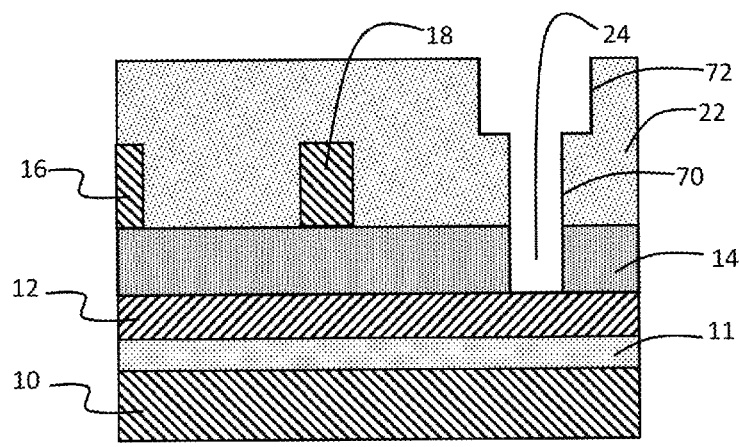
FIG. 9A is a cross-sectional view of the structure of FIG. 9 taken generally along line 9A-9A in FIG. 9.

With reference to FIGS. 9, 9A in which like reference numerals refer to like features in FIGS. 1, 1A and in accordance with alternative embodiments of the invention, the mandrel cut mask 22 may be modified such that the openings in the mandrel cut mask 22 used to form the mandrel cuts 24, 26 have a dual-width shape. Specifically, each of the openings in mandrel cut mask 22 has a narrow section 70 with a width that is equal to the width of the mandrel 20 and a wide section 72 that has a width that is greater than the width of the narrow section 70. The narrow section 70 of the mandrel cut mask 22 is vertically arranged between the hardmask layer 12 and the wide section 72 of the mandrel cut mask 22. The wide section 72 may be formed by a partial lithography process that forms the wide section 72 separately from the narrow section 70.

The mandrel cuts 24, 26 are formed in the mandrels 18, 20 using an etching process, such as reactive ion etching (RIE), that selectively removes the materials of mandrels 18, 20 and the dielectric layer 14 from areas inside the narrow sections 70 of the openings in the mandrel cut mask 22, which are not masked by the mandrel cut mask 22. In this embodiment, the mandrel cut 26 is shortened to illustrate the masking for a tip-to-tip cut that is wider than the tip-to-tip provided by mandrel cut 24. In an alternative embodiment, another mandrel cut (not shown) that is identical to mandrel cut 24 may be formed in mandrel 18 and may be aligned horizontally with the mandrel cut 24 to provide a long cut.

Figure 10:
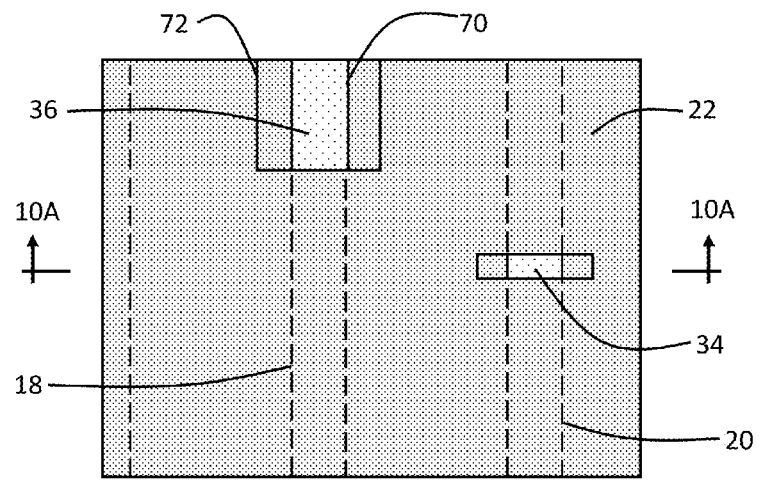
FIGS. 10-14 and FIGS. 10A-14A are respective top and cross-sectional views of the structure at successive fabrication stages of the processing method subsequent to FIG. 9 and FIG. 9A.
Figure 10A:
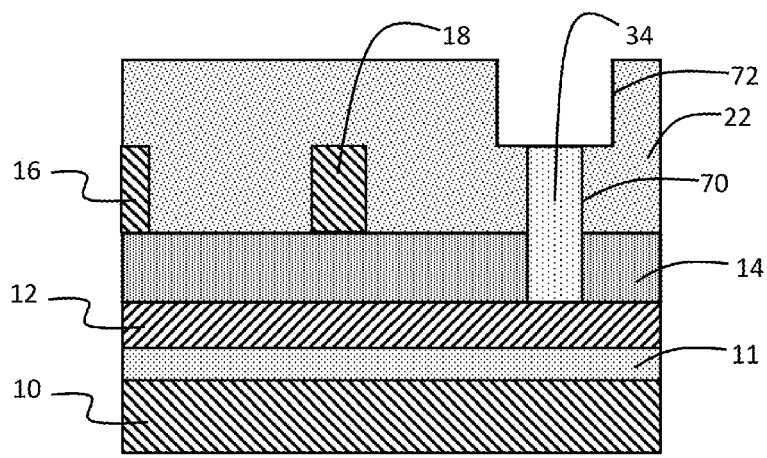

With reference to FIGS. 10, 10A in which like reference numerals refer to like features in FIGS. 9, 9A and at a subsequent fabrication stage, the sections 34, 36 of the mask layer 42 are formed on the areas on the top surface 13 of the hardmask layer 12 exposed through the mandrel cuts 24, 26 (FIGS. 9, 9A). The sections 34, 36 of the mask layer 42 have a height that is greater than or equal to the thickness of the dielectric layer 14 such that the sections 34, 36 project above the top surface 15 of the dielectric layer 14. The section 34 of the mask layer 42 has a width that is equal to the width of the mandrel 18 as a result of the implementation of the dual-width openings in the mandrel cut mask 22. More specifically, the width of the section 34 of the mask layer 42 is constrained by the width of the lower section 70 of the mandrel cut 24 (FIG. 9), and the width of the section 36 of the mask layer 42 is constrained by the width of the lower section 70 of the mandrel cut 26 (FIG. 9).

Figure 11:
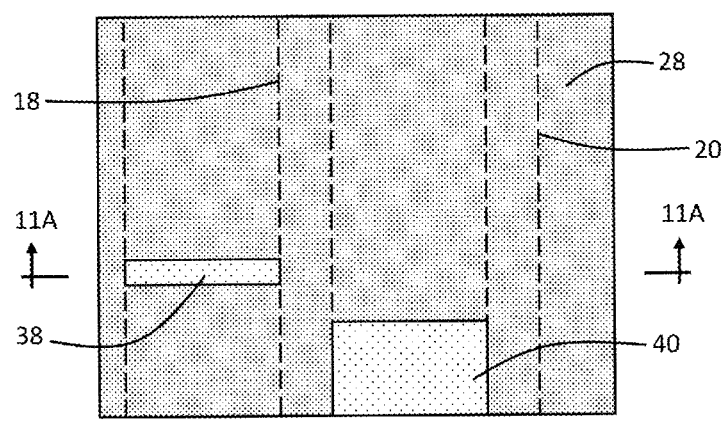
Figure 11A:
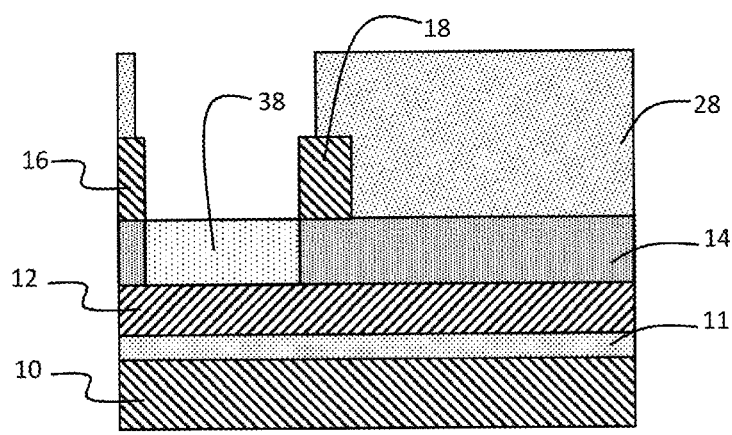

With reference to FIGS. 11, 11A in which like reference numerals refer to like features in FIGS. 10, 10A and at a subsequent fabrication stage, the mandrel cut mask 22 is removed by a cleaning process, and the non-mandrel cut mask 28 is formed on a top surface 15 of the dielectric layer 14. Using the non-mandrel cut mask 28 as an etch mask, the non-mandrel cuts 30, 32 are formed in the dielectric layer 14 using an etching process, such as reactive ion etching (RIE), that removes the material of the dielectric layer 14 from areas not masked by the non-mandrel cut mask 28. In an alternative embodiment, another non-mandrel cut (not shown) that is identical to non-mandrel cut 30 may be formed between mandrel 16 and mandrel 18 and may be aligned horizontally with the non-mandrel cut 28 to provide a long cut.

Figure 12:
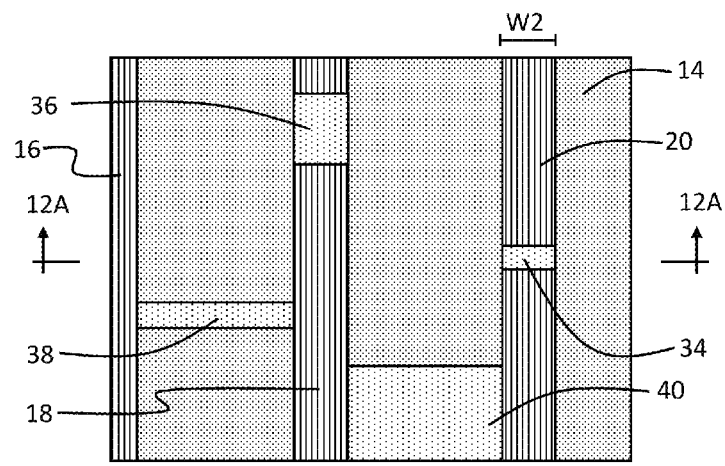
Figure 12A:
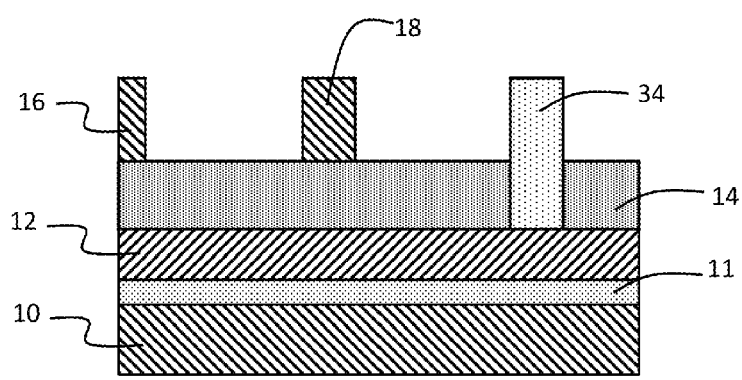

With reference to FIGS. 12, 12A in which like reference numerals refer to like features in FIGS. 11, 11A and at a subsequent fabrication stage, the sections 38, 40 of the mask layer 42 are formed on the areas on the top surface 13 of the hardmask layer 12 exposed through the openings in the non-mandrel cut mask 28 and the non-mandrel cuts 30, 32. The sections 38, 40 of the mask layer 42 have a thickness that is equal to the thickness of the dielectric layer 14.

Figure 13:
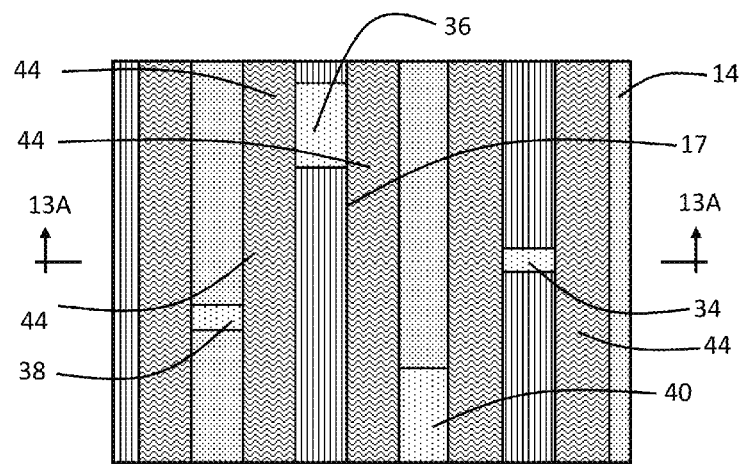
Figure 13A:
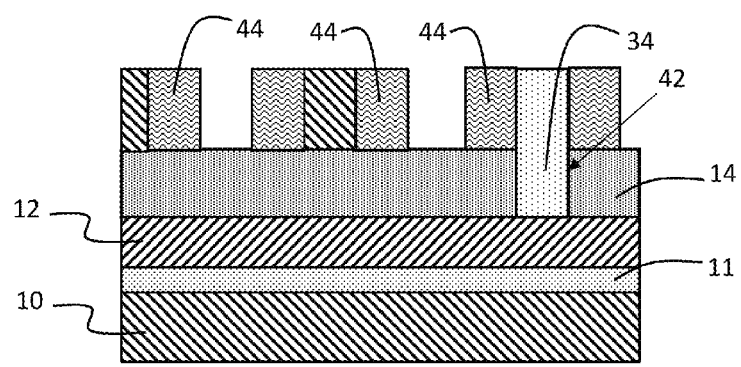

With reference to FIGS. 13, 13A in which like reference numerals refer to like features in FIGS. 12, 12A and at a subsequent fabrication stage, the non-mandrel cut mask 28 is removed by a cleaning process, and sidewall spacers 44 are formed at locations on the top surface 15 of the dielectric layer 14 adjacent to the vertical sidewalls 17 of the mandrels 16, 18, 20. The sections 34, 36, 38, 40 of the mask layer 42 are only partially covered at their edges by the sidewall spacers 44.

Figure 14:
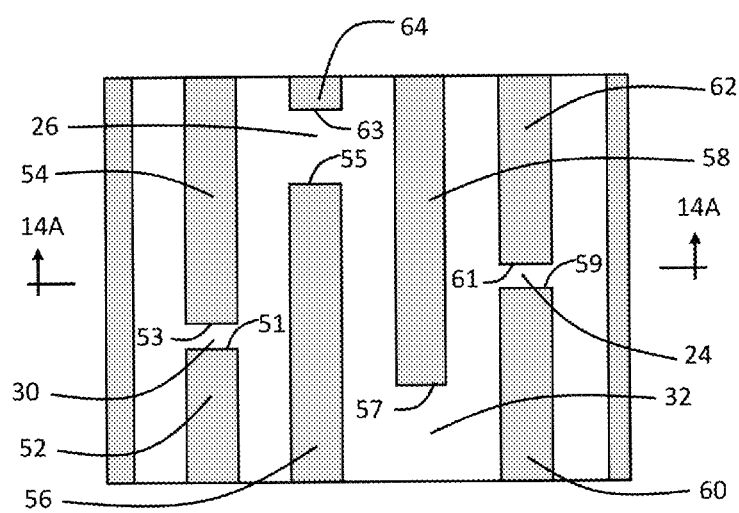
Figure 14A:
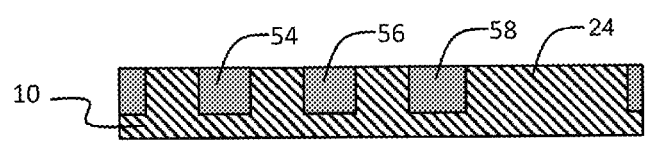

With reference to FIGS. 14, 14A in which like reference numerals refer to like features in FIGS. 13, 13A and at a subsequent fabrication stage, the process continues as described in the context of FIGS. 6, 6A-FIGS. 8, 8A to form the wires 52, 54, 56, 58, 60, 62. Because the mandrel cut 26 is shortened, an additional wire 64 is formed. Dielectric material of the dielectric layer 10 fills the mandrel cut 26 between an end 63 of wire 64 and the end 55 of wire 56. The tip-to-tip distance between the end 55 and the end 63 is greater than the tip-to-tip spacing between the end 59 of wire 60 and the end 61 of wire 62 formed using the mandrel cut 24 and is also longer than twice the width of the sidewall spacers 44.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms such as "vertical", "horizontal", "lateral", etc. are made by way of example, and not by way of limitation, to establish a frame of reference. Terms such as "horizontal" and "lateral" refer to a directions in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   forming a first dielectric layer on a metal hardmask layer;
   forming a mandrel on the first dielectric layer;
   forming a first cut that extends through the first dielectric layer to the metal hardmask layer;
   forming a first section of a metal layer on a first area of the metal hardmask layer exposed by the first cut in the first dielectric layer; and
   after the metal layer is formed, forming a spacer on a vertical sidewall of the mandrel.

2. The method of claim 1 further comprising:
   patterning the metal hardmask layer with the first section of the metal layer and the spacer masking the metal hardmask layer.

3. The method of claim 1 wherein the mandrel is exposed by the first cut, and further comprising:
   removing the section of the mandrel when the first cut is formed in the first dielectric layer.

4. The method of claim 3 wherein the first section of the metal hardmask layer is formed on the first area of the metal hardmask layer after the section of the mandrel is removed.

5. The method of claim 1 wherein the first section of the metal layer has a length and a first width transverse to the length, and the mandrel has a second width that is less than the first width of the first section of the metal layer.

6. The method of claim 1 wherein the first section of the metal layer has a length and a first width transverse to the length, and the mandrel has a second width that is equal to the first width of the first section of the metal layer.

7. The method of claim 1 wherein the first section of the metal layer is partially covered by the spacer.

8. The method of claim 1 wherein the first section of the metal layer is fully covered by the spacer.

9. The method of claim 1 wherein forming the first cut that extends through the first dielectric layer to the metal hardmask layer comprises:
   selectively removing a section of the mandrel when the first cut is formed.

10. The method of claim 9 further comprising:
    forming a second cut that extends through the first dielectric layer to the metal hardmask layer; and
    forming a second section of the metal layer on a second area of the metal hardmask layer exposed by the second cut in the first dielectric layer.

11. The method of claim 10 wherein the first section of the metal layer and the second section of the metal layer are concurrently formed after the first cut and the second cut are formed.

12. The method of claim 10 wherein the first section of the metal layer is formed before the second cut is formed.

13. The method of claim 12 wherein the first dielectric layer has a thickness and a top surface, and the first section of the metal layer projects above the top surface of the first dielectric layer.

14. The method of claim 10 wherein forming the first cut that extends through the first dielectric layer to the metal hardmask layer comprises:
    forming a first sacrificial cut mask patterned with a first opening at an intended location for the first cut; and
    after the first cut is formed, removing the first sacrificial cut mask.

15. The method of claim 14 wherein forming the second cut that extends through the first dielectric layer to the metal hardmask layer comprises:
    after the first sacrificial cut mask is removed, forming a second sacrificial cut mask patterned with a second opening at an intended location for the second cut; and
    removing the second sacrificial cut mask,
    wherein the first section of the metal layer and the second section of the metal layer are concurrently formed after the second sacrificial cut mask is removed.

16. The method of claim 14 wherein the first section of the metal layer is formed before the first sacrificial cut mask is removed, and forming the second cut that extends through the first dielectric layer to the metal hardmask layer comprises:
    after the first sacrificial cut mask is removed, forming a second sacrificial cut mask patterned with a second opening at an intended location for the second cut; and
    after the second cut is formed, removing the second sacrificial cut mask,
    wherein the second section of the metal layer is formed before the second sacrificial cut mask is removed.

17. The method of claim 1 wherein forming the first section of the metal layer on the first area of the metal hardmask layer exposed by the first cut in the first dielectric layer comprises:
    selectively depositing the first section of the metal layer on the first area of the metal hardmask layer.

18. The method of claim 1 wherein the first dielectric layer and the metal hardmask layer are formed as a layer stack on a second dielectric layer, and further comprising:
    patterning the metal hardmask layer with the first section of the metal layer as an etch mask;
    etching a trench in the second dielectric layer with the patterned metal hardmask layer masking the second dielectric layer over the first area; and
    filling the trench with a conductor to form a wire,
    wherein the wire has an end that terminates at a section of the second dielectric layer masked over the first area.

* * * * *